United States Patent
Oota

(10) Patent No.: US 6,299,056 B1
(45) Date of Patent: Oct. 9, 2001

(54) LIGHT-EMITTING DIODE AND MANUFACTURING METHOD THEREOF AND METHOD FOR MOUNTING LIGHT-EMITTING DIODE ON ELECTRIC WIRING BOARD

(75) Inventor: Kiyohisa Oota, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/540,207

(22) Filed: Mar. 31, 2000

(30) Foreign Application Priority Data

Mar. 31, 1999 (JP) .................................................. 11-090512
Feb. 8, 2000 (JP) .................................................. 12-030420

(51) Int. Cl.[7] .................................................. B23K 31/02
(52) U.S. Cl. .................. 228/177; 228/255; 228/179.1
(58) Field of Search ................................. 228/177, 123.1, 228/175, 179.1, 255; 313/500; 340/815.45; 257/88, 99

(56) References Cited

U.S. PATENT DOCUMENTS 3,911,431 * 10/1975 Katsumura et al. .
3,964,296 * 6/1976 Matzuk .
4,315,225 * 2/1982 Allen, Jr. et al. .
4,841,414 * 6/1989 Hibino et al. .
5,265,792    11/1993 Harrah et al. .
5,475,241 * 12/1995 Harrah et al. .
5,654,228 * 8/1997 Shieh et al. .
5,882,949 * 3/1999 Okazaki .
6,174,753 * 1/2001 Liao .

FOREIGN PATENT DOCUMENTS 57-49284      3/1982 (JP) .
405267897a * 10/1993 (JP) .
6-177435      6/1994 (JP) .

* cited by examiner

Primary Examiner—Tom Dunn
Assistant Examiner—Jonathan Johnson
(74) Attorney, Agent, or Firm—Nixon & Vanderhye PC

(57) ABSTRACT

There is provided an LED that can prevent the dissolution and separation of electrodes due to etching in the manufacturing stage and has a high light emission efficiency even when horizontally mounted as well as a method for manufacturing the LED. In a light-emitting diode 100 which is cut from a wafer by dicing and in which a positive electrode 4 and a negative electrode 3 are formed parallel to a pn junction plane 20, the positive electrode 4 provided by a p-side ohmic contact metal layer 41 formed on a surface of a p-type semiconductor layer (p-type GaN layer 2) and a p-side electrode metal layer 42 made of an alloy including gold and nickel, while the negative electrode 3 is provided by an n-side ohmic contact metal layer 31 formed on a surface of an n-type semiconductor layer 1 and an n-side electrode metal layer 32 made of an alloy including gold and nickel. The side surface 7 of a light-emitting diode chip that is brought in contact with a dicing blade is etched by an acid solution.

3 Claims, 6 Drawing Sheets

LIGHT-EMITTING DIODE AND MANUFACTURING METHOD THEREOF AND METHOD FOR MOUNTING LIGHT-EMITTING DIODE ON ELECTRIC WIRING BOARD

BACKGROUND OF THE INVENTION

The present invention relates to a horizontal type light-emitting diode (referred to as an LED hereinafter) to be used as connected to an electric wiring board in a state in which its pn junction plane is perpendicular to the wiring surface of the electric wiring board, a method for manufacturing the LED and a method for connecting the LED to the electric wiring board.

A great many LEDs are used for self-light-emitting type display devices that can be seen clearly even in a dark place or as back illuminators of display devices. In particular, the LEDs are considered most promising as small-size thin type display devices and the back illuminators thereof for use in narrow spaces of letter display sections or number buttons of portable telephone units, finders of cameras and the like.

The LED chip itself has a small side dimension of not greater than 300 $\mu$m. In order to make good use of the properties of the LED, the prior art reference of Japanese Patent Laid-Open Publication No. SHO 57-49284 discloses a horizontal type LED that needs no connection of a metal wire and connects its pn junction plane perpendicular to the wiring surface of an electric wiring board.

FIG. 9 is a perspective view showing a state in which a conventional LED is mounted horizontally on an electric wiring board. In FIG. 9 are shown an n-type semiconductor layer 401, a p-type semiconductor layer 402, a negative electrode 403 and a positive electrode 404. The layers 401 through 404 constitute the conventional LED 400. When connecting the LED 400 to an electric wiring board 408, there have been the processes of temporarily fixing the LED 400 onto the electric wiring board 408 with an adhesive 410 that has an electrical insulating property, connecting the negative electrode 403 to a wiring section 409a of the electric wiring board 408 by means of solder 405 that serves as a brazing material and connecting the positive electrode 404 to a wiring section 409b of the electric wiring board 408 by means of solder 406 that serves as a brazing material. The adhesive 410 is an insulator, and if a pn junction plane 420 is covered with the adhesive 410, then there is the effect of preventing the LED 400 from being damaged through short circuit in the soldering stage.

However, the LED 400 is formed by laminating the n-type semiconductor layer 401 and the p-type semiconductor layer 402 on a semiconductor wafer (not shown) that has a circular shape of a diameter of about 50 mm (or a rectangular shape of a side dimension of about 10 mm) and dicing the semiconductor wafer into squares of a size of about 300 $\mu$m.

Therefore, if the LED 400 is used in a horizontal posture, light is taken out from a side surface 407 of the LED 400, the side surface 407 being brought into contact with a dicing blade. The n-type semiconductor layer 401 and the p-type semiconductor layer 402 of the LED 400 have high refractive indices. Therefore, light generated from the pn junction plane 420 does not go outward since it is reflected inside except for light roughly perpendicularly incident on the side surfaces 407a, 407b and 407c that are the surfaces from which light is taken out.

The above phenomenon will be described with reference to FIG. 10. As shown in FIG. 10, if light A generated in a portion that belongs to the pn junction plane 420 and is located apart from the side surface 407 is emitted in a direction inclined at an angle of not smaller than $\Phi$ relative to the pn junction plane 420, then the light is incident on the positive electrode 404 and disappears through dispersion, absorption and the like. For example, assuming that the pn junction plane 420 has a size D of 300 $\mu$m and the p-type semiconductor layer 402 being transparent to the emitted light has a thickness t of 2 $\mu$m, then the light that can go out of the side surface 407 without being incident on the positive electrode 404 is only the light that is emitted at an angle of not greater than 0.4° relative to the pn junction plane 420.

Conversely, the light that is not incident on the positive electrode 404 even when inclined at an angle $\theta$ of 10° relative to the pn junction plane 420 is the light generated at a point that belongs to the pn junction plane 420 and located within a distance d of not greater than about 10 $\mu$m from the side surface 407. The light emitted at the inclination angle of 10° relative to the pn junction plane 420 is to be inclined at an angle of about 35° relative to the junction plane when radiated outward as refracted at the side surface 407, the angle of about 35° being approximately equal to the angle of radiation of the LED 400. In other words, it can be appreciated that the light can be efficiently taken out when it is generated at a depth d of not greater than about 10 $\mu$m from the side surface 407.

On the other hand, the light emission efficiency of the pn junction plane 420 in the vicinity of the side surface 407 of the LED 400 is lowered due to mechanical damage in the dicing stage. For this reason, if the conventional LED is used in the horizontal posture, then the light emission efficiency is apparently reduced. Therefore, it is proper to etch the portion in the vicinity of the mechanically damaged side surface 407 by immersing the semiconductor in an acid liquid that dissolves the semiconductor. However, there has been the problem that the negative electrode 403 and the positive electrode 404 are also dissolved for the reasons described later.

If the LED is used in the horizontal posture, both the positive electrode and the negative electrode are connected to the wiring sections of the electric wiring board by means of silver paste or solder. Particularly in the case of an LED to be used in a place that may have an elevated temperature, the solder should preferably be used for the connection.

When performing connection by means of solder, the positive electrode 404 and the negative electrode 403 should preferably be provided by a metal such as gold (Au) that has a good affinity with solder and is not eroded by acid. However, it is also well known that, if the positive electrode 404 and the negative electrode 403 are made of only Au, the metal is totally dissolved in the solder, resulting in failed soldering. For this reason, it is a usual practice to employ nickel (Ni) that has a good affinity with solder and cover its surface with Au for the prevention of the oxidation of Ni. However, Ni is eroded by acid. Accordingly, there has been the problem that Ni exposed on the side surfaces is dissolved by the acid when the wafer is divided into small pieces of individual LEDs by dicing and the side surfaces are etched by being immersed in an acid liquid and then falls off together with Au located on Ni.

As shown in FIG. 9, in order to prevent the n-type semiconductor layer 401 and the p-type semiconductor layer 402 of the LED 400 from being damaged through short circuit when connecting the wiring sections 409a and 409b with the positive electrode 404 and the negative electrode 403 of the LED 400 with solders 406 and 405, respectively, the pn junction plane 420 is covered with the adhesive 410 that is an insulator. However, if the quantity of adhesive 410 is small, the portion that belongs to the pn junction plane 420 and is exposed on the side surface 407 cannot be completely covered, frequently causing damage and short circuit of the LED 400. The pn junction plane 420 of the LED 400 is normally located several micrometers to several tens of micrometers apart from the surface of the negative electrode 403 or the positive electrode 404. Therefore, if the quantity of adhesive 410 is increased so as to ensure the covering, then the adhesive 410 adheres to the wiring section 409a or the wiring section 409b, resulting in the failed adhesion of the brazing material. This also leads to the problem that the pn junction plane is hard to be protected by controlling the quantity of the adhesive 410.

SUMMARY OF THE INVENTION

Accordingly, it is an object of the present invention to provide an LED that can prevent the dissolution and separation of electrodes due to etching in the manufacturing stage and has a high light emission efficiency even when horizontally mounted as well as a method for manufacturing the LED.

Another object of the present invention is to provide a method for mounting an electric wiring board with an LED that can easily protect the pn junction plane from a brazing material for connecting the wiring section of the electric wiring board with the electrodes of the LED.

In order to achieve the aforementioned objects, the present invention provides a light-emitting diode in which a positive electrode and a negative electrode are formed parallel to a pn junction plane, wherein the positive electrode is comprised of a p-side ohmic contact metal layer formed on a surface of a p-type semiconductor layer and a p-side electrode metal layer made of an alloy including gold and nickel, and the negative electrode is comprised of an n-side ohmic contact metal layer formed on a surface of an n-type semiconductor layer and an n-side electrode metal layer made of an alloy including gold and nickel.

According to the aforementioned LED, the p-type and n-side electrode metal layers are stabilized without separation and dissolution thereof by alloying Ni that is dissolved in an acid with Au (or Au alloy), and the LED cut by dicing can be etched by the acid solution. This allows a horizontal type LED having high light emission efficiency to be provided by removing a great many mechanical defects occurring on the LED side surface.

According to one aspect of the present invention, there is provided a method for manufacturing a light-emitting diode by cutting out a light-emitting diode chip by dicing from a semiconductor wafer in which a positive electrode and a negative electrode are formed parallel to a pn junction plane, the semiconductor wafer being an n-type semiconductor wafer and the method comprising the steps of:

successively forming an n-type semiconductor layer and a p-type semiconductor layer on the n-type semiconductor wafer;

forming a p-side ohmic contact metal layer and a p-side electrode metal layer made of an alloy including gold and nickel on a surface of the p-type semiconductor layer;

forming an n-side ohmic contact metal layer and an n-side electrode metal layer made of an alloy including gold and nickel on a surface of the n-type semiconductor wafer;

performing dicing for dividing the n-type semiconductor wafer into a plurality of light-emitting diode chips; and etching with an acid solution a side surface of the light-emitting diode chip cut through the dicing.

According to the above method, the electrode metal layers are stabilized with respect to the acid by alloying nickel that is dissolved in the acid with gold (or gold alloy). By etching the side surface by the acid solution, the pn junction located in the vicinity of the LED side surface that has suffered mechanical damage through dicing is removed, and this allows a horizontal type LED having high light emission efficiency to be manufactured.

According to one aspect of the present invention, there is provided a method for manufacturing a light-emitting diode by cutting out a light-emitting diode chip by dicing from a substrate in which a positive electrode and a negative electrode are formed parallel to a pn junction plane, the method comprising the steps of:

successively forming an n-type semiconductor layer and a p-type semiconductor layer on an insulating substrate;

forming a p-side ohmic contact metal layer and a p-side electrode metal layer made of an alloy including gold and nickel on a surface of the p-type semiconductor layer;

forming an n-side ohmic contact metal layer and an n-side electrode metal layer made of an alloy including gold and nickel on a surface of the n-type semiconductor layer;

performing dicing for dividing the insulating substrate into a plurality of light-emitting diode chips; and etching with an acid solution a side surface of the light-emitting diode chip cut through the dicing.

According to the above method, the electrode metal layers are stabilized with respect to the acid by alloying nickel that is dissolved in the acid with gold (or gold alloy). By etching the side surface by the acid solution, the pn junction located in the vicinity of the LED side surface that has suffered mechanical damage through dicing is removed, and this allows a horizontal type LED having high light emission efficiency to be manufactured.

According to one aspect of the present invention, there is provided a method for mounting a light-emitting diode on an electric wiring board by mounting a light-emitting diode having a positive electrode and a negative electrode which are formed parallel to a pn junction plane on an electric wiring board in a manner that the pn junction plane is perpendicular to the electric wiring board and by connecting wiring sections of the electric wiring board with the positive electrode and the negative electrode of the light-emitting diode by means of a brazing material or a conductive paste, the method comprising the steps of:

covering with a photoresist a portion that belongs to the electric wiring board and is opposite to an adhesion surface of the light-emitting diode;

temporarily fixing the light-emitting diode on the photoresist by means of an adhesive; and thereafter connecting the wiring section of the electric wiring board with the positive electrode of the light-emitting diode by means of a brazing material or a conductive paste and connecting the wiring section of the electric wiring board with the negative electrode of the light-emitting diode by means of a brazing material or a conductive paste.

According to the above method, the photoresist can be correctly patterned by using the normal photolithography method. Therefore, insulation of the pn junction plane of the LED with respect to the wiring section of the electric wiring board can be assured, allowing the LED to be prevented from being damaged or short-circuited.

In the LED of one embodiment, at least one out of the p-side electrode metal layer and the n-side electrode metal layer is an alloy of a laminate of a nickel layer and a gold layer, the nickel layer has a thickness of 50 nm to 3000 nm, the gold layer has a thickness of 30 nm to 1000 nm and a volumetric ratio of nickel to gold is one to three.

According to the LED of the above embodiment, the volumetric ratio of nickel to gold is made one to three with the nickel layer thickness ranging from 50 nm to 3000 nm and with the gold layer thickness ranging from 30 nm to 1000 nm. With this arrangement, an electrode metal layer that is neither etched by the acid solution nor dissolved in the solder when connected with solder can be formed. If the nickel layer thickness is not greater than 50 nm, then gold is dissolved in the solder. If the nickel layer thickness exceeds 3000 nm, then the alloying of gold with nickel is hard to perform, and the electrode metal layer tends to be easily oxidized. If the gold layer thickness is not greater than 30 nm, then the quantity of gold becomes relatively less than nickel, by which the electrode metal layer tends to be easily oxidized, and the soldering becomes hard to perform. If the gold layer thickness exceeds 1000 nm, then the quantity of gold becomes relatively so great that the electrode metal layer tends to be easily dissolved in the solder. Likewise, if the volumetric ratio of nickel to gold is lower than one, then the quantity of nickel becomes relatively so small that the electrode metal layer is dissolved in the solder. Therefore, the soldering becomes hard to perform. If the volumetric ratio of nickel to gold exceeds three, then the quantity of nickel becomes relatively so great that the electrode metal layer tends to be easily oxidized and the soldering becomes hard to perform.

In the LED of one embodiment, at least the positive electrode out of the positive electrode and the negative electrode is a partial electrode partially covering the surface of the semiconductor layer that becomes groundwork.

According to the LED of the above one embodiment, at least the p-type electrode layer out of the p-type electrode layer and the n-type electrode layer is etched to be the partial electrode. Therefore, the portion from which the electrode layer is removed by etching is put in a state in which the crystal surface of the semiconductor layer is exposed, and light generated from the pn junction is also emitted from the crystal surface of this semiconductor layer, by which the light emission efficiency is improved.

In the LED of one embodiment, the partial electrode has an arc-shaped or parabolic outer peripheral edge.

According to the LED of the above embodiment, by making the outer peripheral edge of the partial electrode have the arc-like or parabolic shape, the partial electrode and the wiring section of the electric wiring board are connected to each other with the solder shaped as dissolved when the solder adheres to the partial electrode. Therefore, the light emission efficiency can be improved without degrading the connectability even if the partial electrode having a small area is employed.

The method of one embodiment comprises the steps of:

forming an n-side gold alloy layer on a surface of an n-type semiconductor layer;

performing an alloying process of the n-side gold alloy layer for more than five minutes at a temperature of not lower than 400° C., after having formed the n-side gold alloy layer, so as to make the n-side gold alloy layer become an n-side ohmic contact metal layer;

forming a p-side gold alloy layer on a surface of a p-side semiconductor layer;

laminating a surface of the p-side alloy layer with nickel and gold by vapor deposition, sputtering or plating so as to form a p-side laminate;

partially removing the p-side alloy layer and the p-side laminate by a photolithography method;

laminating a surface of the n-side ohmic contact metal layer with nickel and gold by vapor deposition, sputtering or plating so as to form an n-side laminate; and performing an alloying process for more than five minutes at a temperature that is not lower than 300° C. and lower than the temperature of the alloying process for making the n-side alloy layer become the n-side ohmic contact metal layer, after having formed the p-side laminate and the n-side laminate, so as to make the p-side gold alloy layer become the p-side ohmic contact metal layer, alloying the p-side laminate so as to form the p-side electrode metal layer and alloying the n-side laminate so as to form the n-side electrode metal layer.

According to the LED electrode manufacturing method, the n-side gold alloy layer made of Au alloy or the like is formed on the surface of the n-type semiconductor layer, and thereafter the n-type semiconductor layer and the n-side gold alloy layer are brought in ohmic contact with each other through the alloying process performed for more than five minutes at a temperature of not lower than 400° C., consequently forming the n-side ohmic contact metal layer. In this stage, the surface of the p-type semiconductor layer is still exposed. Next, the p-side gold alloy layer made of an Au alloy or the like is formed on the surface of the p-type semiconductor layer. Then, the surface of the p-side gold alloy layer is laminated with nickel and gold by vapor deposition, sputtering or plating, consequently forming the p-side laminate. The p-side gold alloy layer and the p-side electrode metal layer are partially removed by the photolithography method. The surface of the n-side ohmic contact metal layer is laminated with nickel and gold by vapor deposition, sputtering or plating, consequently forming the n-side laminate. A second alloying process is performed for more than five minutes at a temperature that is not lower than 300° C. and lower than the temperature of the alloying process for making the n-side gold alloy layer become the n-side ohmic contact metal layer. Through this alloying process, the p-type semiconductor layer and the p-side gold alloy layer are brought in ohmic contact with each other, consequently forming the p-side ohmic contact metal layer. The p-side laminate is also alloyed to form the p-side electrode metal layer, while the n-side laminate is alloyed to form the n-side electrode metal layer. Through these processes, the positive electrode and the negative electrode that are not dissolved through the etching with the specified acid solution are formed. The positive electrode is partially removed to provide the partial electrode, and therefore, the light emission efficiency can be further improved.

One embodiment further comprises the steps of:

partially removing the n-side glod alloy layer by the photolithography method before performing the alloying process for more than five minutes at the temperature of not lower than 400° C. after having formed the n-side gold alloy layer on the surface of the n-type semiconductor layer.

According to the LED electrode manufacturing method of the above embodiment, the aforementioned negative electrode constructed of the n-side ohmic contact metal layer and the n-side electrode metal layer is partially removed to become the partial electrode, and therefore, the light emission efficiency can be further improved.

According to one aspect of the present invention, there is provided a method for manufacturing a light-emitting diode by cutting out a light-emitting diode chip by dicing from a semiconductor wafer in which a positive electrode and a negative electrode are formed parallel to a pn junction plane, the method comprising the steps of:

forming a p-type semiconductor layer and an n-type semiconductor layer on the semiconductor wafer;

forming a p-side ohmic contact metal layer and a p-side electrode metal layer comprised of an alloy including gold and nickel on a surface of the p-type semiconductor layer;

forming an n-side ohmic contact metal layer and an n-side electrode metal layer comprised of an alloy including gold and nickel on a surface of the n-type semiconductor layer;

dicing the semiconductor wafer so as to form each individual light-emitting diode; and etching a side surface of the light-emitting diode chip cut by a dicing blade by means of an acid solution.

According to the above method, the electrode metal layers are stabilized with respect to the acid by alloying nickel that is dissolved in the acid with gold (or gold alloy). By etching the side surface by the acid solution, the pn junction located in the vicinity of the LED side surface that has suffered mechanical damage through dicing is removed, and this allows a horizontal type LED having high light emission efficiency to be manufactured.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
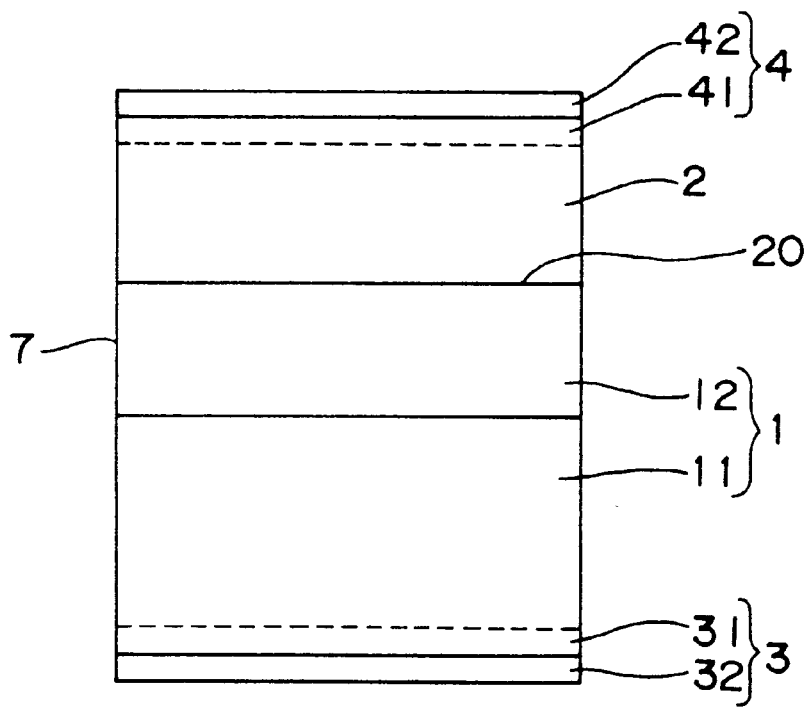
FIG. 1 is a transverse sectional view of an LED according to a first embodiment of the present invention.

An LED, a manufacturing method of the LED and a method for mounting an LED on an electric wiring board according to the present invention will be described in detail below on the basis of the embodiments thereof shown in the drawings.

(First Embodiment)

Figure 9:
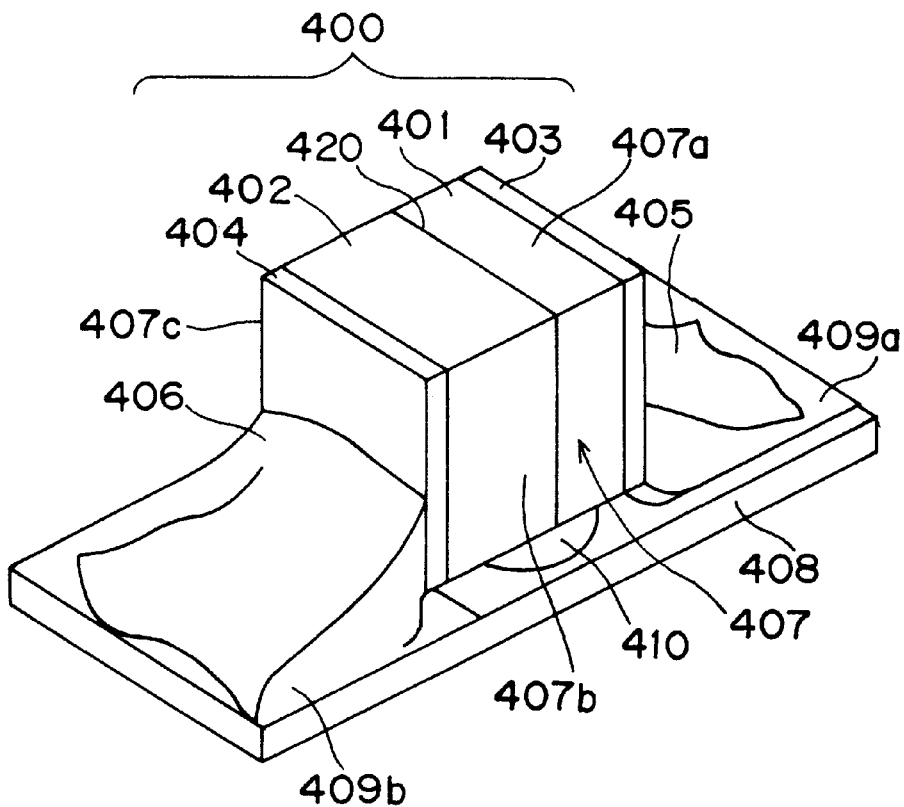
FIG. 9 is a perspective view of a conventional horizontal type LED mounted on an electric wiring board.
Figure 10:
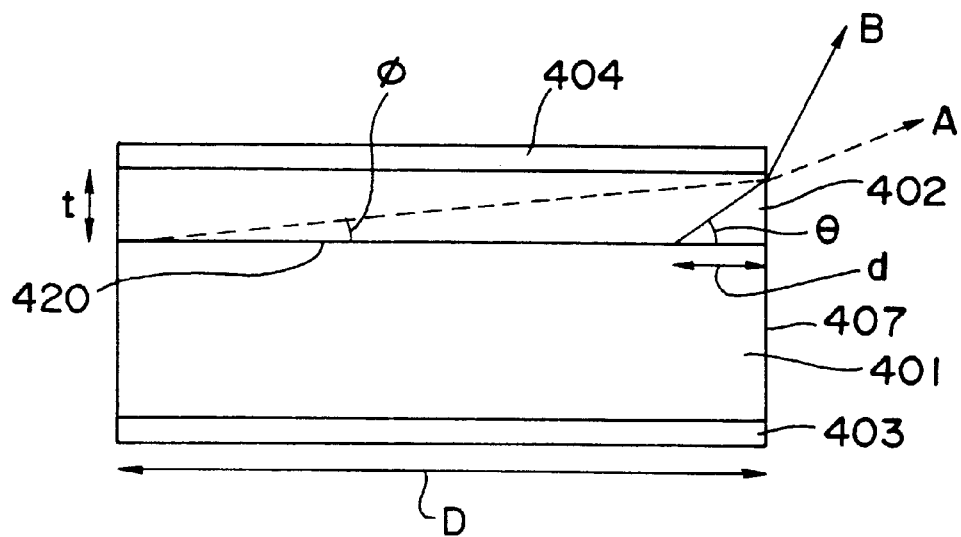
FIG. 10 is a view showing a state in which light generated from the pn junction plane goes outwardly of the LED side surface of the above LED.

FIG. 1 shows the structure of an LED 100 according to a first embodiment of the present invention. The LED is a normal LED having a single hetero structure in which an n-type GaP layer 12 and a p-type GaP layer 2 are successively laminated on an n-type GaP substrate 11. That is, the n-type semiconductor layer 401 of the conventional LED shown in FIG. 9 corresponds to the n-type GaP substrate 11 and the n-type GaP layer 12, while the p-type semiconductor layer 402 shown in FIG. 9 corresponds to the p-type GaP layer 2.

The n-type GaP substrate 11 has a surface provided with an n-side ohmic contact metal layer 31 made of an alloy including Au and Si and an n-side electrode metal layer 32 made of an alloy including Au, Ni and Zn, while the p-type GaP layer 2 has a surface provided with a p-side ohmic contact metal layer 41 made of an alloy including Au and Be (beryllium) and a p-side electrode metal layer 42 made of an alloy including Au, Ni and Zn. The n-side ohmic contact metal layer 31 partially shares an alloyed layer with the groundwork semiconductor layer (n-type GaP substrate 11) through the alloying process, and the alloy interface is indicated by the dashed line. On the other hand, the p-side ohmic contact metal layer 41 partially shares an alloyed layer with the groundwork semiconductor layer (p-type GaP layer 2) through the alloying process, and the alloy interface is indicated by the dashed line.

The n-side electrode metal layer 32 and the p-side electrode metal layer 42 are laminated with an alloy layer of Au and zinc (Zn) (referred to as "Au/Zn" hereinafter) and an Ni layer, respectively, and thereafter subjected to an alloying process for the alloying of Au, Zn and Ni. In this case, roughly same volumetric quantities of Au/Zn and Ni were laminated with each other. If the quantity of Ni is too great, then oxidation tends to occur, and the soldering tends to become hard to perform. If the quantity of Au/Zn is too great, then Ni cannot cover the ohmic contact metal layer, and the soldering tends to become hard to perform. The reason why the alloy of Au and Zn instead of Au is used for the one layer on which the n-side electrode metal layer 32 and the p-side electrode metal layer 42 are formed is to facilitate the handling with an increased hardness of Au. In this case, Zn occupies about several percent by weight and has no specific problem in terms of the connectability with the brazing material. For the same purpose, an alloy of Au and tin (Sn) is also used.

A method for producing the LED 100 will be described next.

First, crystal layers of the n-type GaP layer 12 and the p-type GaP layer 2 are successively formed by the normal liquid phase epitaxial growth method on an n-type GaP substrate 11 having the (111) principal plane and a size of approximately 30 mm×50 mm. After the crystal growth, an Au/Si alloy is deposited on the n-type GaP substrate 11 by a vacuum evaporator (not shown), forming an n-side gold alloy layer that becomes the n-side ohmic contact metal layer 31. For the n-side gold alloy layer that becomes the n-side ohmic contact metal layer 31, an Au/Ge/Ni alloy and an Au/Sn alloy are also frequently used.

Next, the Au/Si alloy is deposited by the sputtering method and then raised in temperature to a temperature of five hundred and several tens of degrees centigrade in a nitrogen ($N_2$) atmosphere so as to perform the alloying process with the groundwork n-type semiconductor (n-type GaP substrate 11), consequently forming the n-side ohmic contact metal layer 31. Next, the processed material is placed again in the vacuum evaporator (not shown) to deposit an Au/Be alloy on the p-type GaP layer 2 that is a clad layer, consequently forming a p-side gold alloy layer that becomes the p-side ohmic contact metal layer 41. For the p-side gold alloy layer that becomes the p-side ohmic contact metal layer 41, an Au/Zn alloy is also frequently used.

Next, Ni and Au/Zn are deposited subsequent to the p-side gold alloy layer that becomes the p-side ohmic contact metal layer 41, consequently forming a p-side laminate that becomes the p-side electrode metal layer 42. Subsequently, Ni and Au/Zn are also deposited on the n-type semiconductor layer 1, consequently forming an n-side laminate that becomes the n-side electrode metal layer 32.

Figure 5A:
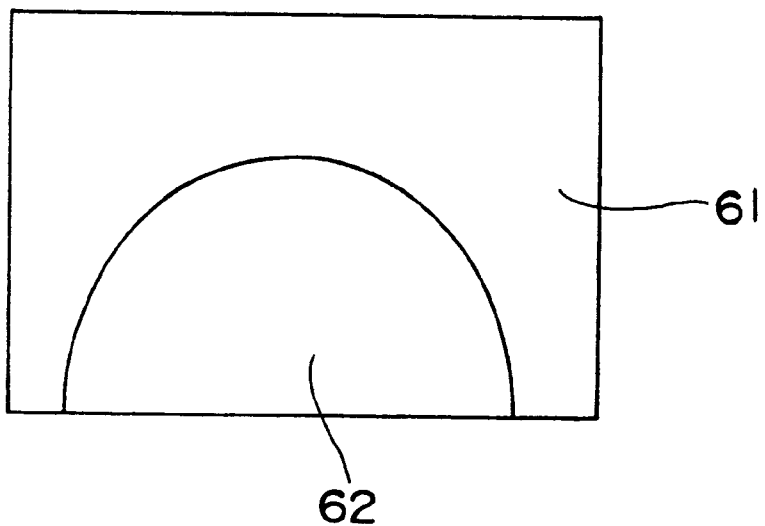
FIGS. 5A and 5B are side views each showing a partial electrode of an LED.
Figure 5B:
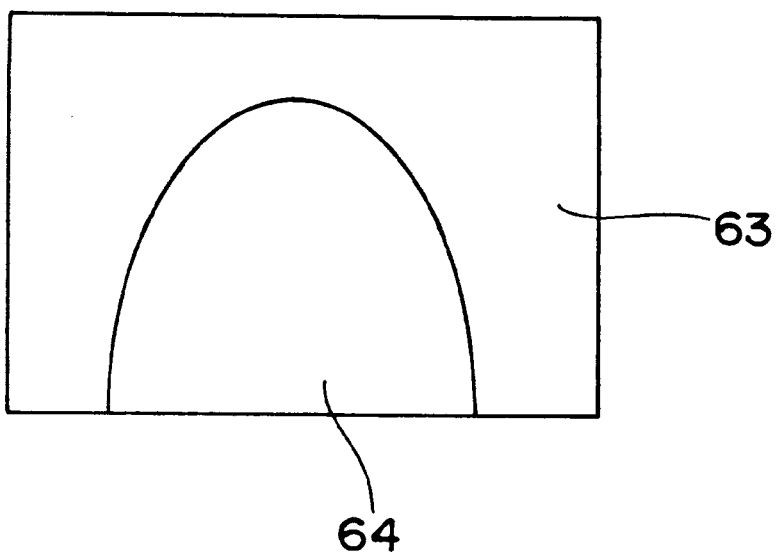

Next, the positive electrode 4 (the p-side gold alloy layer that becomes the p-side ohmic contact metal layer 41 and the p-side laminate that becomes the p-side electrode metal layer 42) is partially removed by the normal photolithography method. In the portion where the p-side gold alloy layer that becomes the p-side ohmic contact metal layer 41 is removed, no light is, of course, absorbed by the positive electrode. However, there is produced no alloy interface generated through the alloying process described later, and therefore, the surface of the p-type semiconductor layer (p-type GaP layer 2) remains the mirror surface. For this reason, light generated at the portion of the pn junction plane 20 located apart from the side surface 7 is also roughly completely reflected on the surface of the p-type semiconductor layer (p-type GaP layer 2). Therefore, light can be taken out of the side surface 7, allowing the light emission efficiency to be further increased. For example, the positive electrode 4 (the p-side gold alloy layer that becomes the p-side ohmic contact metal layer 41 and the p-side laminate that becomes the p-side electrode metal layer 42) is made to have the shape of solder when the solder melts and adheres to the electrode. The partial electrode may be formed into a partial electrode 62 having an arc-shaped outer peripheral edge formed on a part of the surface of a semiconductor layer 61 as shown in FIG. 5A or a partial electrode 64 having a parabolic outer peripheral edge formed on a part of the surface of a semiconductor layer 63 as shown in FIG. 5B. With this arrangement, the light emission efficiency was able to be improved by roughly 40% without degrading the connectability with the electric wiring board.

The processed material is subjected to the alloying process in the $N_2$ atmosphere at a temperature approximately 100° C. lower than the temperature at which the n-side ohmic contact metal layer 31 has been alloyed, consequently forming the p-side ohmic contact metal layer 41 by alloying the p-side gold alloy layer with the groundwork semiconductor layer (n-type GaP substrate 11). By alloying the n-side laminate to form the n-side electrode metal layer 32 and alloying the p-side laminate to form the p-side electrode metal layer 42, completing an LED wafer.

Figure 2:
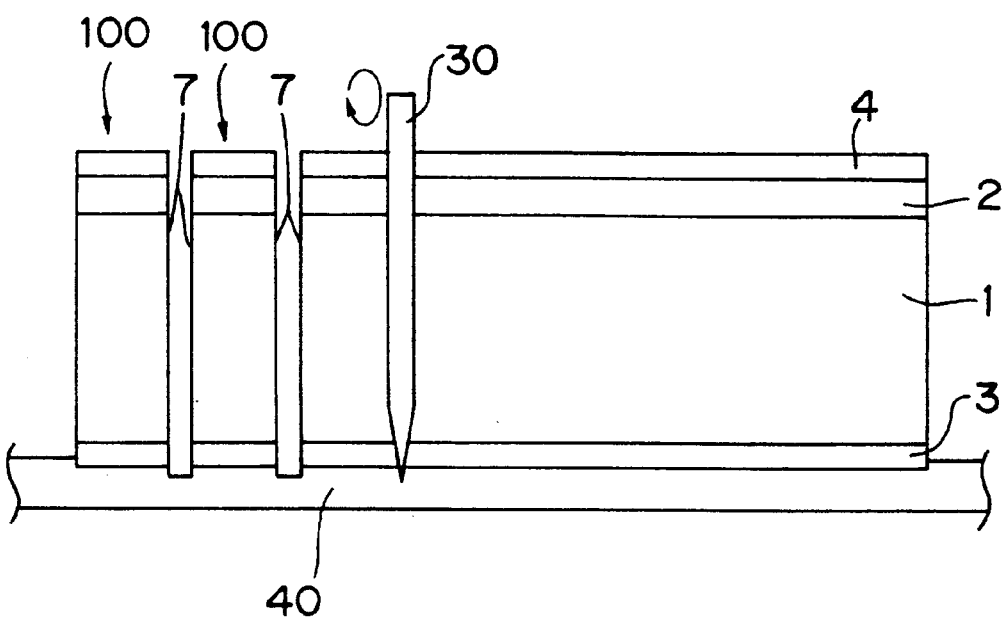
FIG. 2 is a transverse sectional view of the above LED being cut by dicing from an LED wafer.

FIG. 2 shows a state in which the aforementioned LED is being diced. Although FIG. 2 shows only the transverse sectional plane, the dicing is practically performed longitudinally and transversely for the formation of dice chips. The LED wafer constructed of the n-type semiconductor layer 1, p-type semiconductor layer (p-type GaP layer 2), negative electrode 3 and positive electrode 4 is made to adhere to an adhesive sheet 40, and the dicing is performed by inserting a dicing blade 30 partway into the adhesive sheet 40 from above. In this stage, the dicing blade 30 has a side surface provided with an abrasive, and the LED wafer is cut by rotating the blade 30. Therefore, a great many mechanical defects are generated on the side surface 7 through the cutting.

Next, the diced individual LEDs 100 are each stuck to an adhesive tape (not shown) for conveyance use and immersed in an acid etching solution of a mixture of phosphoric acid and hydrogen peroxide for the removal of the semiconductor layer including the mechanical defects in the vicinity of the surface of the LED side surface 7.

The LED 100 of the first embodiment of FIG. 1 is formed through the aforementioned processes.

A method for mounting the LED 100 of the present first embodiment on the electric wiring board 8 will be described with reference to FIG. 3.

Figure 3:
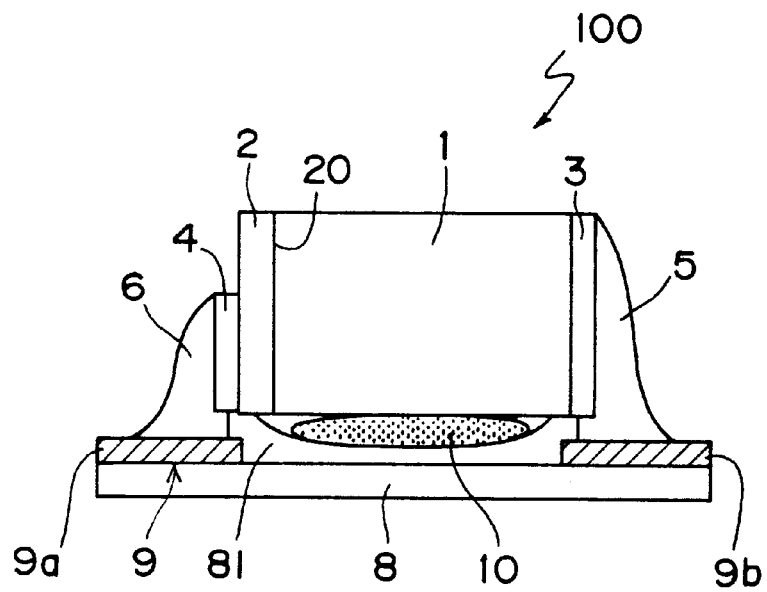
FIG. 3 is a transverse sectional view of the above LED mounted on an electric wiring board.

As shown in FIG. 3, the electric wiring board 8 is preparatorily provided with a wiring section 9 that is a conductor, and a photoresist layer 81 is formed in a portion that belongs to the electric wiring board 8 and is to be mounted with the LED 100. The LED 100 is temporarily fixed to the photoresist layer 81 by means of an epoxy-based adhesive 10 or the like. Subsequently, the negative electrode 3 of the LED 100 is connected to a wiring section 9b by means of a brazing material 5 such as solder, while the positive electrode 4 of the LED 100 is connected to a wiring section 9a by means of a brazing material 6 such as solder. The photoresist layer 81 is made to overlap the wiring sections 9a and 9b, and therefore, the LED 100 and the wiring sections 9a and 9b are separated apart from each other with interposition of the photoresist layer 81. With this arrangement, the pn junction plane 20 of the LED 100 suffers neither damage nor short circuit due to the possible occurrence of the contact of the LED 100 with the wiring sections 9a and 9b. As is well known, the photoresist can be controlled in shape with high accuracy if the photolithography method is used, and therefore, reliable protection can be assured even though the pn junction plane 20 is separated apart by several micrometers from the positive electrode 4 of the LED 100.

The LED 100 of the present invention was electrified to emit light, and it was discovered that the light emission efficiency was almost equivalent to that of the normal LED, meaning the obtainment of a high-efficiency thin type LED.

(Second Embodiment)

Figure 4:
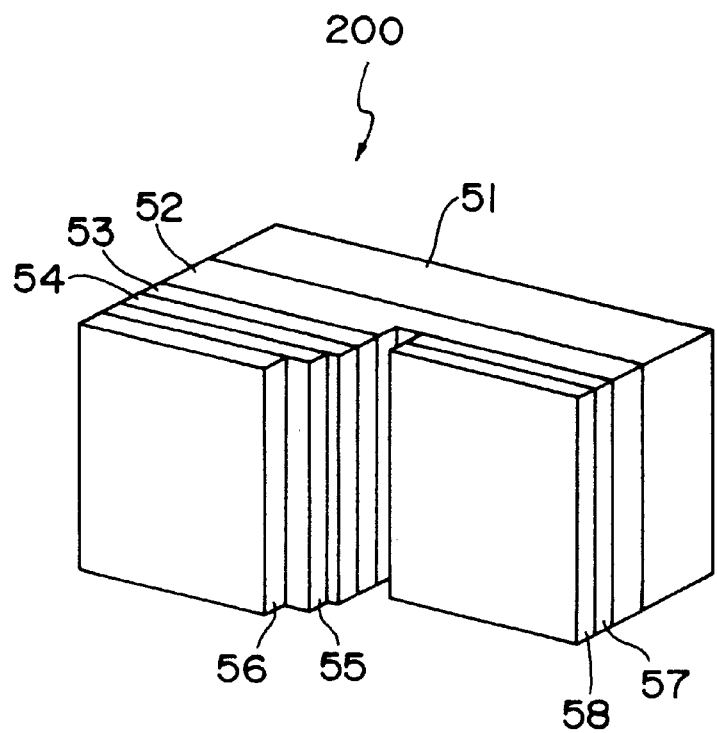
FIG. 4 is a perspective view of an LED laid in a horizontal posture according to a second embodiment of the present invention.

FIG. 4 is a perspective view of an LED laid in a horizontal posture according to a second embodiment of the present invention.

In FIG. 4 are shown a sapphire substrate 51, an n-type GaN clad layer 52, an InGaN light-emitting layer 53 and a p-type GaN clad layer 54. The n-type GaN clad layer 52 includes a buffer layer for alleviating a lattice mismatching with the sapphire substrate 51. The pn junction plane exists inside the InGaN light-emitting layer 53. The LED chip 200 of the present second embodiment shows the case where the substrate 51 is provided by, for example, sapphire having an insulating property. For this reason, the positive electrode and the negative electrode are located on the same side with respect to the substrate 51.

The positive electrode is constructed of a p-side ohmic contact metal layer 55 made of palladium (Pd) and a p-side electrode metal layer 56 made of an Au/Ni alloy. On the other hand, the negative electrode is constructed of an n-side ohmic contact metal layer 57 made of titanium (Ti) and an n-side electrode metal layer 58 made of an Au/Ni alloy on the n-type GaN layer 52 exposed by removing the p-type GaN clad layer 54 and the InGaN light-emitting layer 53.

In the LED chip 200 of the present second embodiment, the p-side ohmic contact metal layer 55 can scarcely be alloyed with the groundwork semiconductor layer (p-type GaN clad layer 54), while the n-side ohmic contact metal layer 57 can scarcely be alloyed with the groundwork semiconductor layer (n-type GaN clad layer 52). As a result, light is reflected on the interface between the p-side ohmic contact metal layer 55 and the groundwork semiconductor layer (p-type GaN clad layer 54) and on the interface between the n-side ohmic contact metal layer 57 and the groundwork semiconductor layer (n-type GaN clad layer 52). Therefore, even if the ohmic contact metal layer is formed on the entire surface, the light emission efficiency can be kept high. The p-type GaN clad layer 54 has a high resistance and a current that is hard to spread, and therefore, it is preferable to totally cover the p-type GaN clad layer 54 with the p-side ohmic contact metal layer 55. On the other hand, the p-side electrode metal layer 56 and the n-side electrode metal layer 58 are separated apart so that the positive electrode and the negative electrode do not short-circuit with each other in the soldering stage.

Also in the case of the LED chip 200 of the present second embodiment, the LED chip was cut from the wafer by dicing, thereafter immersed in an acid etching solution and then mounted on an electric wiring board (not shown). As a result, a horizontal type LED was able to obtain light emission efficiency equivalent to that of the normal LED.

(Third Embodiment)

Figure 6:
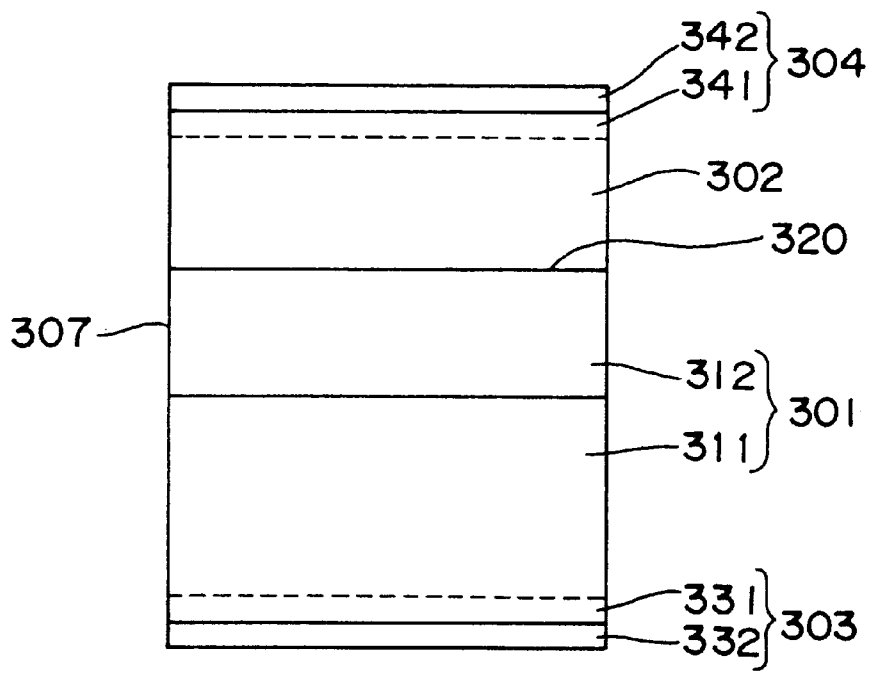
FIG. 6 is a transverse sectional view of an LED according to a third embodiment of the present invention.

FIG. 6 shows the structure of an LED 300 according to a third embodiment of the present invention. This LED 300 is an LED having the normal single hetero structure in which an n-type GaP layer 312 and a p-type GaP layer 302 are successively laminated on an n-type GaP substrate 311. That is, the n-type semiconductor layer 401 of the conventional LED shown in FIG. 9 corresponds to the n-type GaP substrate 311 and the n-type GaP layer 312, while the p-type semiconductor layer 402 shown in FIG. 9 corresponds to the p-type GaP layer 302.

The n-type GaP substrate 311 has a surface provided with an n-side ohmic contact metal layer 331 made of an alloy including Au and an n-side electrode metal layer 332 made of an alloy including Au and Ni, while the p-type GaP layer 302 has a surface provided with a p-side ohmic contact metal layer 341 and a p-side electrode metal layer 342 made of an alloy including Au. The n-side ohmic contact metal layer 331 partially shares an alloyed layer with the groundwork semiconductor layer (n-type GaP substrate 311) through the alloying process, and the alloy interface is indicated by the dashed line. On the other hand, the p-side ohmic contact metal layer 341 partially shares an alloyed layer with the groundwork semiconductor layer (p-type GaP layer 302) through the alloying process, and the alloy interface is indicated by the dashed line.

The n-side electrode metal layer 332 and the p-side electrode metal layer 342 are each formed by laminating an Au alloy layer, an Ni layer and an Au alloy layer and thereafter executing an alloying process so as to further alloy Ni with the Au alloy layer. In this case, roughly same volumetric quantities of Au alloy and Ni are laminated with each other. If the quantity of Ni is too great, then oxidation tends to easily occur, and the soldering tends to become hard to perform. If the quantity of Ni is small, then the electrode is dissolved in the solder, and the soldering tends to become hard to perform.

A method for producing the LED 300 will be described next.

First, crystal layers of the n-type GaP layer 312 and the p-type GaP layer 302 are made to grow on the n-type GaP substrate 311 having a diameter of approximately 50 mm by the normal liquid phase epitaxial growth method. After the growth of the crystals, an n-side gold alloy layer that becomes the n-side ohmic contact metal layer 331 is formed of a material of an Au alloy on the n-type GaP substrate 311 by a vacuum evaporator or the like (not shown). The n-side gold alloy layer that becomes the n-side ohmic contact metal layer 331 has a thickness of about 100 to 500 nm. For the Au alloy material, an Au/Zn alloy and Au/Si alloy are frequently used.

Next, the n-side gold alloy layer that becomes the n-side ohmic contact metal layer 331 is deposited by the sputtering method and then raised in temperature to a temperature of not lower than 400° C. in a nitrogen (N$_2$) atmosphere so as to perform the alloying process with the groundwork n-type semiconductor layer (n-type GaP substrate 311) for more than five minutes, consequently forming the n-side ohmic contact metal layer 331. Next, the processed material is placed again in the vacuum evaporator or the like (not shown) to form a p-side gold alloy layer that becomes the p-side ohmic contact metal layer 341 on the p-type GaP layer 302 that is a clad layer using the Au alloy layer as a material. The p-side gold alloy layer that becomes the p-side ohmic contact metal layer 341 has a thickness of about 100 to 500 nm. For this Au alloy material, an Au/Zn alloy and Au/Be alloy are. frequently used.

Next, Ni and an Au alloy are successively deposited as a p-side laminate that becomes the p-side electrode metal layer 342 by the vacuum evaporator or the like subsequent to the p-side gold alloy layer that becomes the p-side ohmic contact metal layer 341. Subsequently, Ni and an Au are also successively deposited as an n-side laminate that becomes the n-side electrode metal layer 332 on the n-side ohmic contact metal layer 331. In this case, Ni has a thickness of 50 nm to 3000 nm. The Au alloy on Ni is formed for the purpose of preventing the oxidation of Ni, and Au may also be used. If Ni and Au are formed by sputtering, then an Ni/Au target may also be used for the formation.

Next, the positive electrode 304 (the p-side gold alloy layer that becomes the p-side ohmic contact metal layer 341 and the p-side laminate that becomes the p-side electrode metal layer 342) is partially removed by the normal photo-lithography method. In the portion where the p-side ohmic contact metal layer 341 is removed, no light is, of course, absorbed by the positive electrode. However, there is produced no alloy interface generated through the alloying process described later, and therefore, the surface of the p-type semiconductor layer (p-type GaP layer 302) remains the mirror surface. For this reason, light generated at the portion of the pn junction plane 320 located apart from the side surface 307 is also reflected roughly completely on the surface of the p-type semiconductor layer (p-type GaP layer 302). Therefore, light can be taken out of the side surface 307, allowing the light emission efficiency to be further increased. For example, with the positive electrode (the p-side gold alloy layer that becomes the p-side ohmic contact metal layer 341 and the p-side laminate that becomes the p-side electrode metal layer 342) having an arc-shaped or parabolic outer peripheral edge shape (shown in FIGS. 5A and 5B), the light emission efficiency was able to be improved by roughly 40% without degrading the connectability with the electric wiring board. The reason why the outer peripheral edge shape of the electrode is formed into the arc-shaped or parabolic shape is to make the electrode shape have the shape of the melted solder when the solder adheres to the p-side electrode metal layer 342. The processed material is subjected again to the alloying process in an N$_2$ atmosphere for more than five minutes at a temperature that is not lower than 300° C. and lower than the temperature of the alloying process for alloying the n-side ohmic contact metal layer 331, by which the p-side gold alloy layer and the groundwork semiconductor layer (n-type GaN substrate 311) are alloyed to form the p-type ohmic contact metal layer 341. The n-side laminate is alloyed to form the n-side electrode metal layer 332, and the p-side laminate is alloyed to form the p-side electrode metal layer 342, completing an LED wafer.

Figure 7:
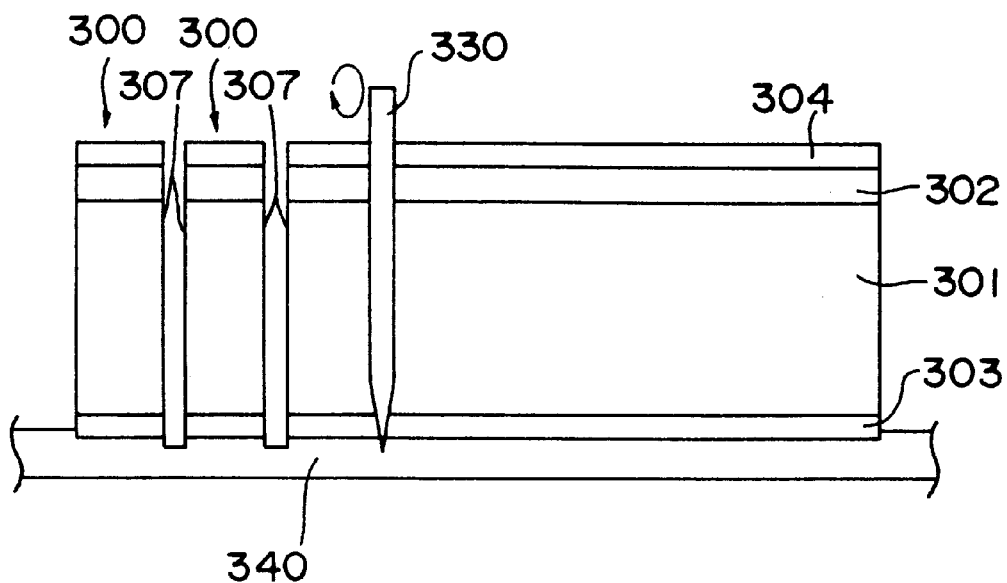
FIG. 7 is a transverse sectional view of the above LED being cut by dicing from an LED wafer.

FIG. 7 shows a state in which the aforementioned LED is being diced. Although FIG. 7 shows only the transverse sectional plane, the dicing is practically performed longitudinally and transversely for the formation of dice chips. The LED wafer constructed of the n-type semiconductor layer 301, p-type semiconductor layer 302, negative electrode 303 and positive electrode 304 is made to adhere to an adhesive sheet 340, and the dicing is performed by inserting a dicing blade 330 partway into the adhesive sheet 340 from above. In this stage, the dicing blade 330 has a side surface provided with an abrasive, and the LED wafer is cut by rotating the blade 330. Therefore, a great many mechanical defects are generated on the side surface 307 through the cutting.

Next, the diced individual LEDs 300 are each stuck to an adhesive tape (not shown) for conveyance use and immersed in an acid etching solution of a mixture of phosphoric acid and hydrogen peroxide for the removal of the semiconductor layer including the mechanical defects in the vicinity of the surface of the LED side surface 307.

The LED 300 of the present third embodiment shown in FIG. 6 is formed through the aforementioned processes.

A method for mounting the LED 300 of the present third embodiment on the electric wiring board 308 will be described with reference to FIG. 8.

Figure 8:
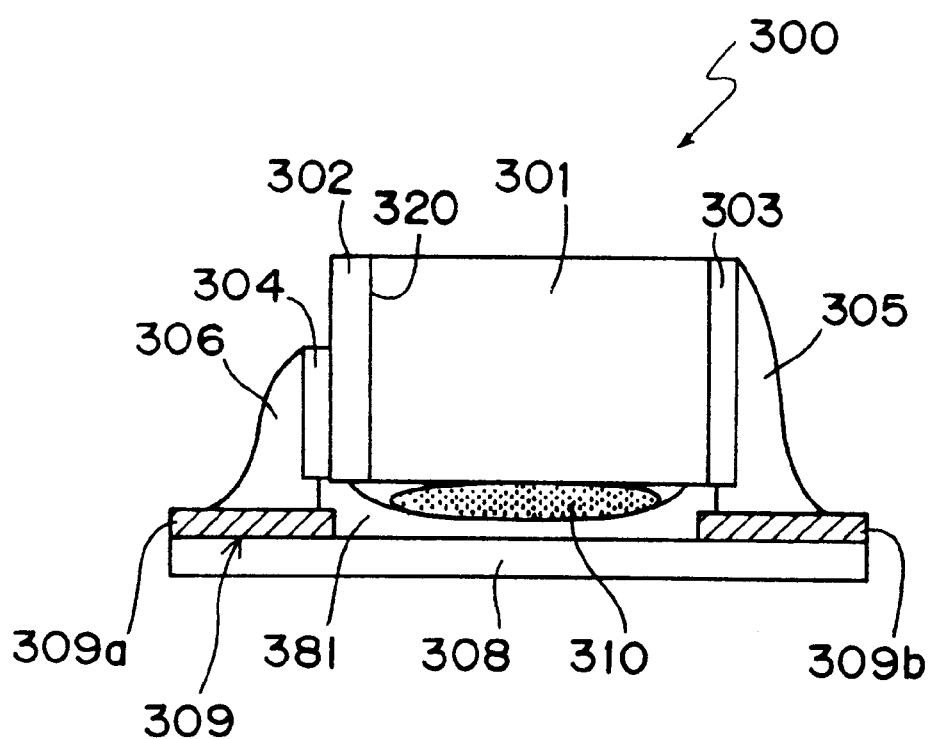
FIG. 8 is a transverse sectional view of the above LED mounted on an electric wiring board.

As shown in FIG. 8, the electric wiring board 308 is preparatorily provided with a wiring section 309 that is a conductor. A photoresist layer 381 is formed in the portion that belongs to the electric wiring board 308 and is to be mounted with the LED 300. The LED 300 is temporarily fixed by means of an epoxy-based adhesive 310 or the like. Subsequently, the negative electrode 303 of the LED 300 is connected to a wiring section 309b by means of a brazing material 305 such as solder, while the positive electrode 304 of the LED 300 is connected to a wiring section 309a by means of a brazing material 306 such as solder. A photoresist layer 381 is made to overlap the wiring sections 309a and 309b, and therefore, the LED 300 and the wiring sections 309a and 309b are separated apart from each other with interposition of the photoresist layer 381. With this arrangement, the LED 300 suffers neither damage nor short circuit due to the possible occurrence of the contact of the pn junction plane 320 of the LED 300 with the wiring sections 309a and 309b. As is well known, the photoresist can be controlled in shape with high accuracy if the photolithography method is used, and therefore, reliable protection can be assured even though the pn junction plane 320 is separated apart by several micrometers from the positive electrode 304 of the LED 300.

The LED 300 of the present invention was electrified to emit light, and it was discovered that the light emission efficiency was almost equivalent to that of the normal LED, meaning the obtainment of a high-efficiency thin type LED.

The aforementioned description is based on the semiconductor light-emitting device of the GaP system or the GaN system. However, the present invention is not limited to this and is, of course, able to be applied to an LED of any material system such as a III–V-group compound semiconductor light-emitting device of a GaAlAs system, an InGaAlP/GaAs system or an InGaAsP/InP system or a II–VI-group compound semiconductor light-emitting device so long as the LED satisfies the spirit of the present invention.

According to the aforementioned first through third embodiments, the volumetric ratio of nickel to gold is made to be one to three with the nickel layer thickness ranging from 50 nm to 3000 nm and with the gold layer thickness ranging from 30 nm to 1000 nm. With this arrangement, the p-side and n-side electrode metal layers that are neither etched by the acid solution nor dissolved in the solder when connected with solder can be formed.

As is apparent from the above description, according to the LED of the present invention, the LED cut by dicing can be treated by an acid solution in the horizontal type LED in which the positive electrode and the negative electrode are formed parallel to the pn junction plane. This allows a horizontal type LED having high light emission efficiency to be provided by removing a great many mechanical defects occurring on the LED side surface.

According to the LED manufacturing method of one embodiment, the pn junction located in the vicinity of the LED side surface that has suffered mechanical damage through dicing is removed by etching by means of an acid solution the side surface of the LED cut by dicing, allowing a horizontal type LED having a high light emission efficiency to be manufactured.

According to the method for mounting the LED on the electric wiring board of one embodiment, there are the processes of covering the portion that belongs to the electric wiring board and is mounted with the pn junction plane of the LED with a photoresist, temporarily fixing the LED by means of an adhesive and connecting the wiring section of the electric wiring board with the positive electrode and the negative electrode of the LED by means of the brazing material and the conductive paste. This photoresist can control the shape with high accuracy by the normal photolithography method. Therefore, insulation of the pn junction plane of the LED from the wiring section of the electric wiring board can be reliably achieved, preventing the damage and short circuit of the LED.

According to the LED of one embodiment, the volumetric ratio of nickel to gold is made to be one to three with the nickel layer thickness ranging from 50 nm to 3000 nm and with the gold layer thickness ranging from 30 nm to 1000 nm. With this arrangement, the p-side and n-side gold electrode metal layers that are neither etched by the acid solution nor dissolved in the solder when connected with solder can be formed.

According to the LED of one embodiment, at least the p-type electrode layer out of the p-type electrode layer and the n-type electrode layer is etched to become the partial electrode. Therefore, the portion removed by etching comes to have the exposed crystal surface of the semiconductor layer, and light emitted from the pn junction plane is also emitted from the crystal surface of this semiconductor layer, improving the light emission efficiency.

According to the LED of one embodiment, by forming the outer peripheral edge of the partial electrode into the arc-like or parabolic shape, the partial electrode and the wiring section of the electric wiring board are connected to each other with the solder shaped as dissolved when the solder adheres to the partial electrode. Therefore, the light emission efficiency can be improved without degrading the connectability even if the partial electrode having a small area is employed.

According to the LED electrode manufacturing method of one embodiment, by bringing the p-type semiconductor layer in ohmic contact with the p-side alloy layer through a second alloying process performed for more than five minutes at a temperature that is not lower than 300° C. and is lower than the temperature of the alloying process for making the n-side alloy layer become the n-side ohmic contact metal layer so as to form the p-side ohmic contact metal layer, alloying the p-side laminate to form the p-side electrode metal layer and alloying the n-side laminate to form the n-side gold electrode metal layer, the positive electrode and the negative electrode that are not dissolved by the etching with the specified acid solution can be provided, and the positive electrode is partially removed to become the partial electrode. Therefore, the light emission efficiency can be further improved.

According to the LED electrode manufacturing method of one embodiment, by partially removing the n-side gold alloy layer by the photolithography method before performing the alloying process for more than five minutes at the temperature of not lower than 400° C. after the formation of the n-side gold alloy layer on the surface of the n-type semiconductor layer, the negative electrode constructed of the n-side ohmic contact metal layer and the n-side electrode metal layer is partially removed to become the partial electrode. Therefore, the light emission efficiency can be further improved.

According to the LED electrode manufacturing method of one embodiment, the pn junction in the vicinity of the LED side surface that has suffered mechanical damage through dicing is removed by etching by means of the acid solution the side surface of the LED cut by dicing, a horizontal type LED having a high light emission efficiency can be manufactured.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for mounting a light-emitting diode on an electric wiring board by mounting a light-emitting diode having a positive electrode and a negative electrode which are formed parallel to a pn junction plane on an electric wiring board in a manner that the pn junction plane is perpendicular to the electric wiring board and by connecting wiring sections of the electric wiring board with the positive electrode and the negative electrode of the light-emitting diode by means of a brazing material or a conductive paste, the method comprising:

covering with a photoresist a portion that belongs to the electric wiring board and is opposite to an adhesion surface of the light-emitting diode in a manner such that the photoresist at least partially overlaps the respective wiring sections of the electric wiring board and so that the pn junction plane is separated from the wiring sections of the wiring board via the photoresist;

temporarily fixing the light-emitting diode on the photoresist by means of an adhesive; and thereafter connecting the wiring section of the electric wiring board with the positive electrode of the light-emitting diode by means of a brazing material or a conductive paste and connecting the wiring section of the electric wiring board with the negative electrode of the light-emitting diode by means of a brazing material or a conductive paste.

2. A method for mounting a light-emitting diode on an electric wiring board, the light-emitting diode including a positive electrode and a negative electrode which are formed parallel to a pn junction plane, the method comprising:

covering a portion of the wiring board opposite an adhesion surface of the diode with a photoresist;

adhering the light-emitting diode over at least a portion of the photoresist;

electrically connecting a wiring section of the wiring board with the positive electrode of the light-emitting diode via at least a brazing material or a conductive paste, and electrically connecting a wiring section of the wiring board with the negative electrode of the light-emitting diode via at least a brazing material or a conductive paste; and wherein said covering comprises causing at least a portion of the photoresist to overlap at least a portion of one of the wiring sections.

3. A method for mounting a light-emitting diode on an electric wiring board, the light-emitting diode including a positive electrode and a negative electrode which are formed parallel to a pn junction plane, the method comprising:

covering a portion of the wiring board opposite an adhesion surface of the diode with a photoresist so that the photoresist at least partially overlaps first and second spaced apart portions of a wiring section of the wiring board;

adhering the light-emitting diode over at least a portion of the photoresist; and electrically connecting the first portion of the wiring section of the wiring board with the positive electrode of the light-emitting diode via at least a brazing material or a conductive paste, and electrically connecting the second portion of the wiring section of the wiring board with the negative electrode of the light-emitting diode via at least a brazing material or a conductive paste.

* * * * *